United States Patent [19]

Gruenwald

[11] 4,052,665
[45] Oct. 4, 1977

[54] CAPACITIVE PICKUP DEVICE FOR PULSATING HIGH VOLTAGE MEASUREMENTS

[75] Inventor: Clifford F. Gruenwald, Franksville, Wis.

[73] Assignee: Snap-On Tools Corporation, Kenosha, Wis.

[21] Appl. No.: 672,257

[22] Filed: Mar. 30, 1976

[51] Int. Cl.² ............... G01R 31/12; G01R 31/02; G01R 19/16

[52] U.S. Cl. .................. 324/54; 324/61 R; 324/72.5; 324/126

[58] Field of Search ............ 324/51, 72.5, 61 P, 324/54, 126, 127, 133, 149, 17, 61 R

[56] References Cited

U.S. PATENT DOCUMENTS

| | | | |
|---|---|---|---|
| 2,445,808 | 7/1948 | Stenstrom | 324/54 |
| 2,750,562 | 6/1956 | Starr | 324/72.5 X |
| 2,804,592 | 8/1957 | Biskeborn | 324/61 P |
| 2,808,566 | 10/1957 | Douma | 324/127 |
| 3,477,024 | 11/1969 | Pelta | 324/126 |
| 3,524,133 | 8/1970 | Arndt | 324/133 X |
| 3,798,541 | 3/1974 | Campbell et al. | 324/72.5 |
| 3,970,932 | 7/1976 | Harvey | 324/133 |

FOREIGN PATENT DOCUMENTS 1,058,890  2/1967  United Kingdom ............ 324/126

Primary Examiner—Gerard R. Strecker
Attorney, Agent, or Firm—Vogel, Dithmar, Stotland, Stratman & Levy

[57] ABSTRACT

A capacitive pickup device for deriving a measurable voltage which is a linear function of the magnitude of pulsating high voltage of the order of 15 to 40 kilovolts in an insulated conductor, the pickup device having a pair of electrically conducting plate members connected together electrically to form one plate element of a capacitor, the conductor itself forming the other plate element of the capacitor and the conductor insulation forming the dielectric. The pickup device also includes a pair of electrically conducting plates respectively carried in spaced relation with the plate members, the plates being centrally relieved to accommodate the plate members and adapted to be connected to ground. An indicating and protective gaseous conduction lamp is electrically connected between the plate members and plates, and a capacitor and a resistor are connected in parallel across the lamp to form an output circuit for connection to apparatus for indicating in linear manner the magnitude of the high voltage in the conductor. The plate members and plates are relatively movable so they selectively may open and close for receiving a portion of the insulated conductor without requiring conductor disconnection.

6 Claims, 7 Drawing Figures

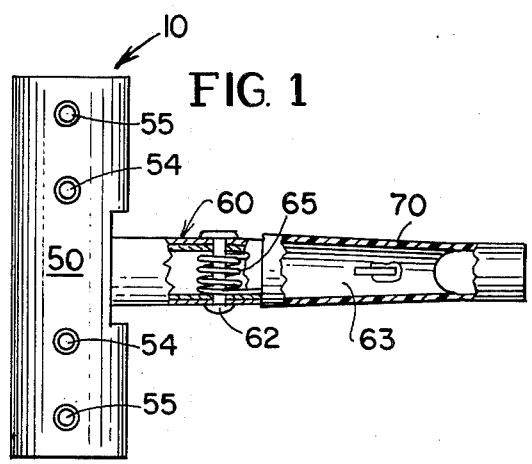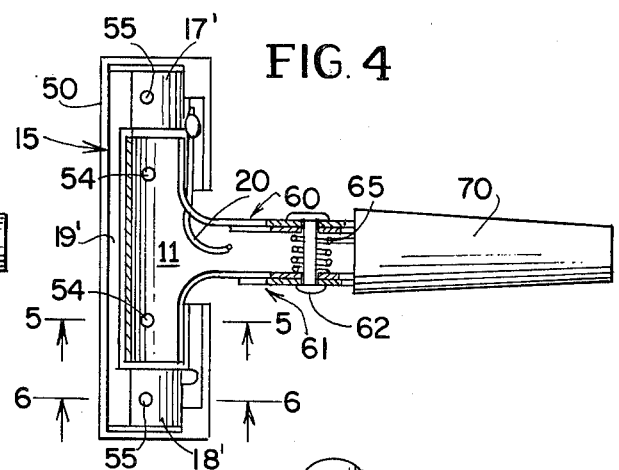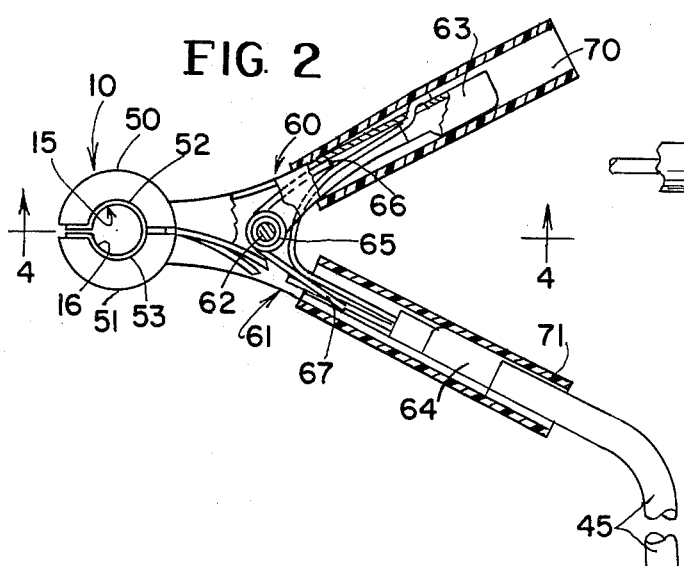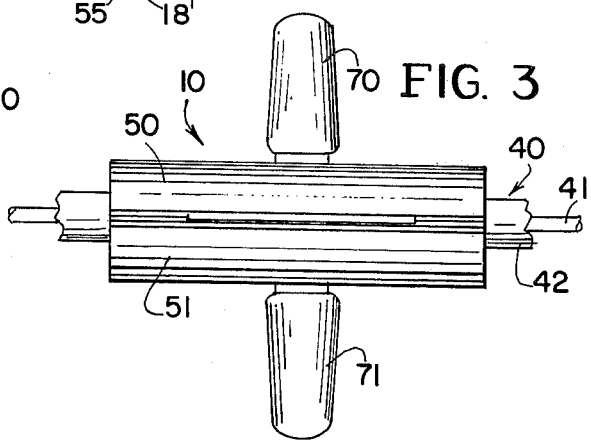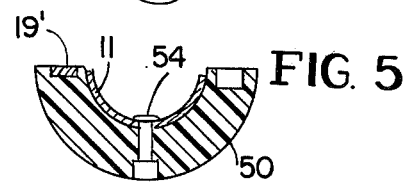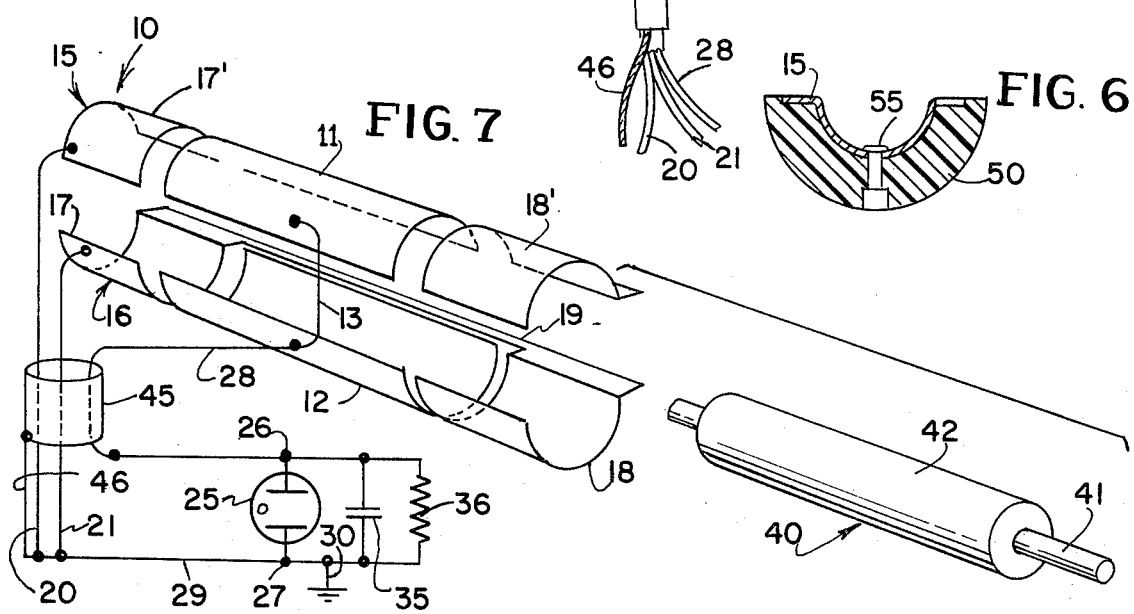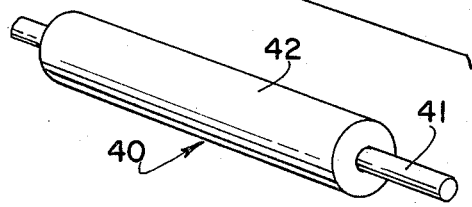

CAPACITIVE PICKUP DEVICE FOR PULSATING HIGH VOLTAGE MEASUREMENTS

BACKGROUND OF THE INVENTION

This invention relates to a pickup device for deriving a measurable voltage which is a linear function of the magnitude of pulsating high voltage in an insulated conductor, and more particularly to such a pickup device of the capacitive type for pulsating voltages of the order of 15 to 40 kilovolts.

The pickup device of the invention has been developed for use in testing apparatus, particularly testing apparatus for trouble shooting work on the ignition system of internal combustion engines. While apparatus with which the pickup device is used may be capable of making tests in the low voltage portions of the ignition system, the present capacitive pickup device is used only in connection with making tests in the high voltage portions, for example, the cable leading from the coil to the distributor of the engine and the cables leading from the distributor to the respective spark plugs.

One object of the invention is to provide a capacitive pickup device for use with an insulated conductor of pulsating high voltage, the device providing a measurable voltage which is a linear function of the magnitude of the voltage on the conductor.

Another object of the invention is to provide a capacitive pickup device capable of being applied to and removed from a high voltage conductor without the need for disconnecting either end of the conductor.

Still another object of the invention is to provide a capacitive pickup device having electrical features that cooperate to minimize the fringing effects of extraneous electric fields which otherwise would introduce error in voltage applied by the device to associated testing apparatus.

Applicant does not know of any comparable capacitive pickup device prior to the present invention.

SUMMARY OF THE INVENTION

The invention contemplates a capacitive pickup device for deriving a measurable voltage which is a linear function of the magnitude of pulsating high voltage in an insulated conductor, the high voltage being of the order of 15 to 40 kilovolts such as encountered in ignition systems of internal combustion engines.

The pickup device includes a pair of electrically conducting generally semicylindrical plate members connected together electrically to form a first plate element of a capacitor. The plate members are mounted in opposing relation for relative movement so they selectively may be opened and closed to encircle closely a portion of the insulated conductor without requiring conductor disconnection. The conductor itself forms the other plate element of the capacitor, and the insulation on the conductor constitutes dielectric material between the two plate elements.

A pair of electrically insulated members having concave faces respectively are secured to the convex faces of the plate members, and extend beyond the ends of the plate members.

A pair of electrically conducting semicylindrical plates respectively are mounted on the insulated members in spaced relation with the plate members. The plates are relieved centrally to accommodate the plate members, and are adapted to be connected to ground in associated apparatus. The ground plates cooperate to minimize the fringing effects of extraneous electric fields so the voltage appearing on the plate members is more nearly a linear function of the high voltage on the insulated conductor.

Also cooperating to improve linearity and protect users and associated apparatus is a voltage limiting output means comprising gaseous conduction lamp electrically connected between the plate members and the grounded plates, and a capacitor and a resistor connected in parallel across the lamp form an output circuit for connection to apparatus for indicating in linear manner the magnitude of the high voltage in the conductor.

Conductors in a shielded cable respectively connect the plate members and plates to the terminals of the lamp, and the cable shield is adapted to be connected to ground.

In more detailed aspect, the means mounting the plate members and plates for relative movement comprise a pair of elongated manual members pivoted together intermediate the ends thereof, the plate members and plates disposed in opposing relation on corresponding ends of the manual members, the other corresponding ends serving as handles.

A spring means extends between the pivoted manual members and urges the manual members in direction to close the plate members and plates. In preferred form, the plate members and pivoted manual members are integral, and a sleeve of electrically insulating material is provided on the handle of each manual member.

Other objects, advantages and details of the invention will be apparent as the description proceeds, reference being had to the accompanying drawing wherein a preferred form of the invention is shown. It is to be understood that the description and drawing are illustrative only, and that the scope of the invention is to be measured by the appended claims.

BRIEF DESCRIPTION OF THE DRAWING

FIG. 1 is a top plan view partly broken away and in section of a capacitive pickup device embodying the invention.

FIG. 2 is a side elevational view, partly broken away and in section, of the pickup device of the invention.

FIG. 3 is a front elevational view showing the pickup device in operational position on an insulated conductor.

FIG. 4 is a plan view of one of the two similar subassemblies of the pickup device, the view taken substantially on line 4—4 of FIG. 2.

FIG. 5 is a sectional view on line 5—5 of FIG. 4.

FIG. 6 is a sectional view on line 6—6 of FIG. 4

FIG. 7 is a simplified perspective view of the pickup device, including a schematic representation of circuitry forming part of the invention, a portion of insulated conductor being shown for completeness.

DESCRIPTION OF THE PREFERRED EMBODIMENT

Referring to the drawing, FIG. 7 shows the capacitive pickup device of the invention in simplified form. The components shown in FIG. 7 will be described first, and thereafter the remaining parts will be described with reference to the other figures.

The capacitive pickup device of the invention, generally designated 10, includes a pair of electrically conducting generally semicylindrical plate members 11 and 12 connected together electrically by conductor 13 to form a first plate element of a capacitor.

Pickup device 10 also includes a pair of electrically conducting generally semicylindrical plates 15 and 16 mounted, as will be seen, in spaced relation with plate members 11 and 12. The plates 15 and 16 are centrally relieved to accommodate plate members 11 and 12 as shown in FIG. 7, and also in FIG. 4 as to plate 15.

The plates 15 and 16 are similar in shape and size, and plate 16 has end portions 17 and 18 disposed beyond the ends of associated plate member 12, the end portions 17 and 18 being connected to each other by integral web 19. Plate 15 has corresponding end portions 17' and 18' and an integral web 19' (FIG. 5). Plates 15 and 16 are adapted to be connected to ground in an associated circuit by means of conductors 20 and 21.

Means for mounting plate members 11 and 12 and plates 15 and 16 for relative movement will be described later.

A gaseous conduction lamp 25 is connected between plate members 11 and 12, on the one hand, and plates 15 and 16 on the other hand. Lamp 25 has terminals 26 and 27, and a conductor 28 extends from the conductor 13 between plate members 11 and 12 to terminal 26. Conductor 29 extends from conductors 20 and 21 of plates 15 and 16 to lamp terminal 27 which is grounded at 30. Lamp 25, as will be seen, indicates by flickering when the pickup device is exposed to punctured conductor insulation, and provides high voltage protection to associated apparatus and to the user.

A capacitor 35 and a resistor 36 are connected in parallel across lamp 25 to form an output circuit for connection to apparatus for indicating in linear manner the magnitude of the measured high voltage.

Still referring to FIG. 7, an insulated high voltage conductor 40 with which capacitive pickup device 10 of the invention is used includes metallic conductor 41 and surrounding insulation material 42. When device 10 is clamped in operative position on insulated conductor 40, plate members 11 and 12, as mentioned, form a first plate element of a capacitor, and conductor 41 forms the second plate element. Insulation material 42 forms the dielectric between the two plate elements, as will be understood.

Capacitive pickup device 10 in FIG. 7 includes a shielded cable generally designated 45, the previously mentioned conductors 20, 21 and 28 being components thereof. The shield of shielded cable 25 is a ground wire 46 spirally wound around the other conductors and connected to conductor 29 extending to ground 30.

Referring now to the other figures of the drawing, and particularly FIGS. 2 and 3, a pair of electrically insulating members 50 and 51 having concave faces 52 and 53 (FIG. 2) are respectively secured to the convex faces of plate members 11 and 12 by suitable means 54 (FIGS. 1, 4 and 5). Alternatively, insulating members 50 and 51 may be secured to plate members 11 and 12 by molding the former on the latter if desired. Insulating members 50 and 51 extend beyond the ends of plate members 11 and 12, as best shown in FIG. 4 with respect to insulating member 50 and plate member 11.

Still referring to FIG. 4, centrally relieved plate 15 (and its counterpart plate 16) has its end portions 17' and 18' secured to the extending ends of insulating member 50 by securing means 55 (FIGS. 1, 4 and 6). Alternatively, insulating members 50 and 51 may be molded on plates 15 and 16 if desired.

Means are provided, as mentioned, for mounting plate members 11 and 12 and plates 15 and 16 for relative movement so they selectively may open for receiving an insulated conductor 40 without requiring conductor disconnection and close to form substantially a cylinder closely encircling the conductor. In the illustrated form of invention, the mounting means includes a pair of elongated manual members generally designated 60 and 61, best shown in FIG. 2. Manual members 60 and 61 are pivoted together on pin 62 (FIGS. 1, 2 and 3) intermediate the ends thereof. Plate members 11 and 12 and plates 15 and 16 disposed in opposing relation on corresponding ends of manual members 60 and 62, and the other corresponding ends 63 and 64 (FIG. 2) serve as handles.

A spring means 65 (FIGS. 1, 2 and 4) is associated with manual members 60 and 62, the spring means effective to urge the manual members in direction to close plate members 11 and 12 and plates 15 and 16. As shown, spring means 65 is a spiral spring surrounding pivot pin 62, the spring ends 66 and 67 (FIG. 2) extending tangentially from the spiral spring into effective engagement with handles 63 and 64.

Pickup device 10 is shown in closed condition in FIG. 2. In this condition spring ends 66 and 67 bias handles 63 and 64 away from each other, thereby closing plate members 11 and 12 and plates 15 and 16. Handles 63 and 64, of course, merely are moved toward each other to overcome the bias of spring means 65 and thus open the plate members and plates for application of the pickup device 10 to an insulated conductor 40. The device 10 is shown applied to a conductor 40 in FIG. 3.

In the form of the invention illustrated, plate members 11 and 12 are integral parts of manual members 60 and 61. This integral relationship involving plate member 11 and manual member 60 is best shown in FIG. 4.

Sleeves 70 and 71 (FIGS. 2 and 3) of electrically insulating material respectively enclose handles 63 and 64 for added safety.

Having described the illustrated form of the invention, it should be noted in conclusion that plates 15 and 16 are highly significant components of the pickup device 10. Plates 15 and 16, as previously mentioned, function to minimize the fringing effects of extraneous fields on the voltage appearing on plate members 11 and 12, thereby enhancing the linearity of the voltage appearing across capacitor 35 and resistor 36 in the output circuit.

Gaseous conduction lamp 25 functions as a voltage regulating protective device (1) to prevent damage to associated apparatus, (2) to prevent electrical shock to the user, and (3) as an indicator. Lamp 25 flickers when the pickup device is exposed to punctured conductor insulation, and tells the user the high voltage insulated conductor 40 should be replaced.

From the above description it is thought that the construction and advantage of this invention will be readily apparent to those skilled in the art. Various changes in detail may be made without department from the spirit or losing the advantages of the invention.

Having thus described the invention, what is claimed as new and desired to secure by Letters Patent is:

1. A capacitive pickup device for deriving a measurable voltage which is a linear function of the magnitude of pulsating high voltage in an insulated conductor, comprising:
   a pair of electrically conducting generally semicylindrical plate members connected together electrically to form a first plate element of a capacitor;
   means mounting said plate members for relative movement so they selectively may open for receiving an insulated conductor without requiring conductor disconnection and close to form substantially a cylinder closely encircling the conductor, the conductor forming a second plate element of the capacitor and the insulation thereon forming the dielectric between the two plate elements;

a pair of electrically insulating members having concave faces respectively secured to the convex faces of said plate members and extending beyond the ends of said plate members;

a pair of electrically conducting generally semicylindrical plates respectively secured to the concave faces of said insulating members in spaced relation with said plate members, said plates centrally relieved to accommodate said plate members and adapted to be connected to ground, said plates functioning to minimize the fringing effects of extraneous electric fields on the voltage appearing on said plate members; and voltage limiting output means electrically connected between said plate members and said plates to provide high voltage protection to the user and associated apparatus and to form an output circuit for connection to apparatus for indicating in linear manner the magnitude of the high voltage in the conductor.

2. The capacitive pickup device of claim 1 wherein the electrical connections between said plate members and said lamp and said plates and said lamp are components of a shielded cable with the shield thereof adapted to be connected to ground.

3. The capacitive pickup device of claim 1 wherein said means mounting said plate members for relative movement comprise a pair of elongated manual members pivoted together intermediate the ends thereof, said plate members disposed in opposing relation on corresponding ends of said manual members, the other corresponding ends serving as handles.

4. The capacitive pickup device of claim 3 with the addition of spring means extending between said pivoted manual members, said spring means urging said manual members in direction to close said plate members.

5. The capacitive pickup device of claim 3 wherein said plate members and said pivoted manual members are integral, and with the addition of a sleeve of electrically insulating material on the handle of each manual member.

6. The capacitive pickup device of claim 1 wherein said voltage limiting output means comprises a gaseous conduction lamp electrically connected between said plate members and said plates and adapted to indicate by flickering when the pickup device is exposed to punctured conductor insulation, and a capacitor and a resistor connected in parallel across said lamp.

* * * * *

UNITED STATES PATENT AND TRADEMARK OFFICE
CERTIFICATE OF CORRECTION

PATENT NO. : 4,052,665
DATED : October 4, 1977
INVENTOR(S) : Clifford F. Gruenwald It is certified that error appears in the above-identified patent and that said Letters Patent are hereby corrected as shown below:

```
Column 1, line 68, cancel "ground" and substitute -- grounded
Column 3, line 53, after "suitable" insert -- securing -- .
Column 5, line 26, after "claim", cancel "1" and substitute
-- 6 -- .
Column 6, line 3, after "claim", cancel "1" and substitute
-- 6 -- .
```

Signed and Sealed this

Twenty-first Day of March 1978

[SEAL]

Attest:

RUTH C. MASON
Attesting Officer

LUTRELLE F. PARKER
Acting Commissioner of Patents and Trademarks